(12) United States Patent
Kwon

(10) Patent No.: US 7,289,251 B2
(45) Date of Patent: Oct. 30, 2007

(54) IMAGE SENSOR

(75) Inventor: Oh Bong Kwon, Kyonggi-do (KR)

(73) Assignee: Hynix Semiconductor Inc., Ichon-shi (KR)

( * ) Notice: Subject to any disclaimer, the term of this patent is extended or adjusted under 35 U.S.C. 154(b) by 839 days.

(21) Appl. No.: 10/201,278

(22) Filed: Jul. 24, 2002

(65) Prior Publication Data

US 2003/0020971 A1 Jan. 30, 2003

(30) Foreign Application Priority Data

Jul. 25, 2001 (KR) .......................... 10-2001-44945

(51) Int. Cl.
*H04N 1/04* (2006.01)

(52) U.S. Cl. ...................... 358/474; 358/482; 358/483; 348/355; 348/340

(58) Field of Classification Search ................ 358/474, 358/482, 483, 513, 514; 348/335, 340, 355; 438/70, 631
See application file for complete search history.

(56) References Cited

U.S. PATENT DOCUMENTS

| | | | | |
|---|---|---|---|---|
| 5,270,869 A | * | 12/1993 | O'Brien et al. ............. 359/820 |
| 5,294,790 A | * | 3/1994 | Ohta et al. .................. 250/216 |
| 5,844,290 A | * | 12/1998 | Furumiya ................... 257/432 |
| 5,877,492 A | * | 3/1999 | Fujieda et al. ........... 250/208.1 |
| 6,059,428 A | * | 5/2000 | Perlo et al. .................. 362/268 |
| 6,379,992 B2 | * | 4/2002 | Jo ................................ 438/70 |
| 2001/0009251 A1 | * | 7/2001 | Sekizawa et al. ...... 219/121.73 |
| 2001/0009442 A1 | * | 7/2001 | Fukuyoshi et al. ......... 348/335 |

FOREIGN PATENT DOCUMENTS

| | | |
|---|---|---|
| JP | 06-037289 A | 2/1994 |
| JP | 06-140612 A | 5/1994 |
| JP | 10-229181 A | 8/1998 |
| JP | 11-150254 A | 6/1999 |
| JP | 11-186530 A | 7/1999 |
| JP | 2000-36587 A | 2/2000 |
| JP | 2000-114503 A | 4/2000 |

* cited by examiner

*Primary Examiner*—Aung S. Moe
*Assistant Examiner*—Negussie Worku
(74) *Attorney, Agent, or Firm*—Birch, Stewart, Kolasch & Birch, LLP

(57) ABSTRACT

An image sensor is disclosed, in which the image sensor changes the diameter of a lens from the center area of a chip to an edge thereof to obtain uniform sensitivity as a whole. The image sensor includes a plurality of light-receiving portions for converting a signal corresponding to the light of an object to an electrical signal, and a pixel array area having a plurality of micro lenses formed above the light receiving portions and respectively corresponding to the light-receiving portions to focus the light. In the image sensor, the respective micro lenses change their diameters from the center of the pixel array area to the edge thereof.

17 Claims, 4 Drawing Sheets

$\theta_2 < \theta_1$ $\theta_4 < \theta_3$
$\theta_2 < \theta_4$
$\theta_1 < \theta_3$ 43a=43b=43c=43d,
44a=44b=44c,
41a<41b<41c<41d,
45a>45b>45c

IMAGE SENSOR

This application claims the benefit of the Korean Application No. 2001-44954 filed on Jul. 25, 2001, which is hereby incorporated by reference.

BACKGROUND OF THE INVENTION

1. Field of the Invention

The present invention relates to an image sensor, and more particularly, to an image sensor that increases the diameter of a lens from the center of a chip to its edge to obtain uniform sensitivity as a whole.

2. Discussion of the Related Art

Research to increase the photo sensitivity in manufacturing an image sensor is on going. One example of such research is the light-condensing technology.

For example, an effort for increasing the fill factor (the ratio of a light-receiving portion to the whole image sensor area) is being made to improve the photo sensitivity in a CMOS image sensor having a light-receiving portion for sensing the light and a CMOS logic circuit part where the sensed light is converted to an electric signal to be used as data.

The problem awaiting solution, other than a matter of the fill factor in the light-condensing technology, is to overcome the sensitivity difference between areas according to the incident angle.

This is a critical factor that determines the quality of the equipment required for an extreme near-by pick-up.

A micro lens construction of a related art image sensor and the photo sensitivity between areas according to light incident angles will be described with reference to the accompanying drawings.

FIG. 1 is a sectional block diagram of a related art image-sensor, and FIGS. 2A and 2B are block diagrams; illustrating respective light paths in the case of a long-distance pick-up and a near-by pick-up.

In the related art, a micro lens used in a CCD or CMOS image sensor controls the light path and increases the total amount of the light received.

In other words, in the related art, micro lenses formed on one chip have the same shape and size as one another.

As shown in FIG. 1, a micro chip 13 has micro lenses 12 which are positioned above light-receiving portions 11 and respectively corresponding to them. Every micro lens 12 has the same diameter 'III' and the same height 'I '.

That is, the micro lenses are formed with an identical size whether they are on the center part of the chip or on the edge of the chip.

Also, the light-receiving portions 11 are designed in such a way that they have the same size 'II' as one another and the distance 'IV' between the respective light-receiving portions 11 is uniform whether they are on the center part of the chip or on the edge of the chip.

The distance 'V' between the micro lenses 12 is designed to be uniform as well.

In the related art image sensor, the incident angle of the light depends on the position of a chip. Also, the photo sensitivity deteriorates as the incident angle is maximized in case of an extreme near-by pick-up.

FIG. 2A is a block diagram illustrating a long distance pick-up. As shown in FIG. 2A, the incident angle of the light has different degrees as a chip is differently positioned.

FIG. 2B is a block diagram illustrating an extreme near-by pick-up. As shown in FIG. 2B, the incident angle is maximized at the edge of a chip A path of the light started from an object 15 is focused by passing through a lens 14 and it has different incident angles on the center part of the image sensor chip 13 compared to the edge of the chip.

That is, as shown in FIG. 2A, the incident angle 01 at the edge of the image sensor chip is bigger than the incident angle 02 on the center part of the chip. Also, as shown in FIG. 2B the incident angle 03 at the edge of the image sensor chip is bigger than the incident angle 04 on the center part of the chip.

The change of the incident angle is more noticeable in the case of a near-by pick-up (FIG. 2). Thus, even on the same area of the chip, the light incident angle 04 is bigger than 02, and the light incident 03 is bigger than 01.

At this instance, on the part that the incident 03 is positioned and on its neighboring pixels, the incident angle becomes much bigger such that the pick-up of the object is difficult as the incident angle falls out of a permissible range.

Since the incident angle differs as its location on the chip changes, sensitivity of the light differs on the respective light-receiving portions.

The related art image sensor has a number of limitations as follows:

First, because the micro lenses are identically designed despite the difference in the light incident angles according to different chip areas a difference in the photo sensitivity occurs in these areas.

Second, the pick-up or decoding of information may be impossible. Even though the unevenness caused by the photosensitivity difference in case of a general pick-up is invisible to the naked eye, when equipments required for an extreme near-by pick-up (e.g., equipments required for a pick-up/detection of dot code) are used, the characteristic differences caused by the photo sensitivity difference are very big such that, a pick-up or decoding of information is impossible.

SUMMARY OF THE INVENTION

Accordingly, the present invention is directed to an image sensor that substantially obviates one or more problems due to limitations and disadvantages of the related art.

An object of the present invention is to provide an image sensor that changes the diameter of a lens from the center part of a chip to the edge of the chip, thereby obtaining an even sensitivity as a whole.

To achieve this object and other advantages and in accordance with the purpose of the present invention, as embodied and broadly described herein, the image sensor of the present invention includes a plurality of light-receiving portions for converting a signal corresponding to the light of an object, to an electric signal, and a pixel array area having a plurality of micro lenses respectively positioned above their corresponding light-receiving portions for focusing the light. The respective micro lenses change their diameters from the center part of the pixel array area to the edge thereof.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
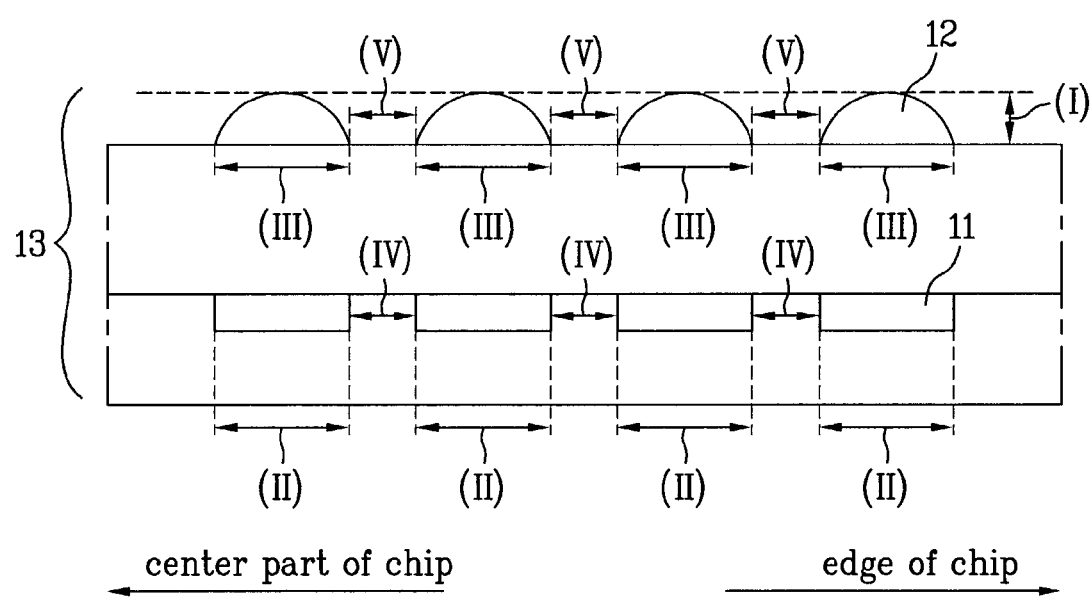
FIG. 1 is a sectional block diagram illustrating a related art image sensor.
Figure 2A:
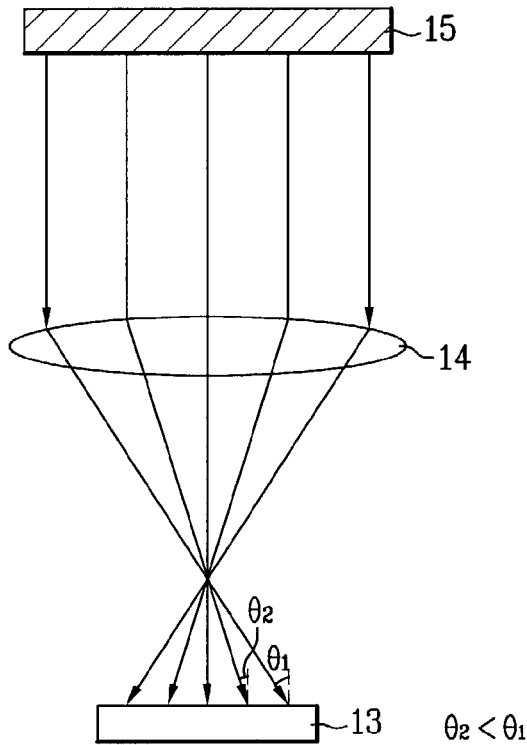
FIGS. 2A and 2B are block diagrams illustrating light paths respectively in case of a long-distance pick-up and a nearby pick-up.
Figure 2B:
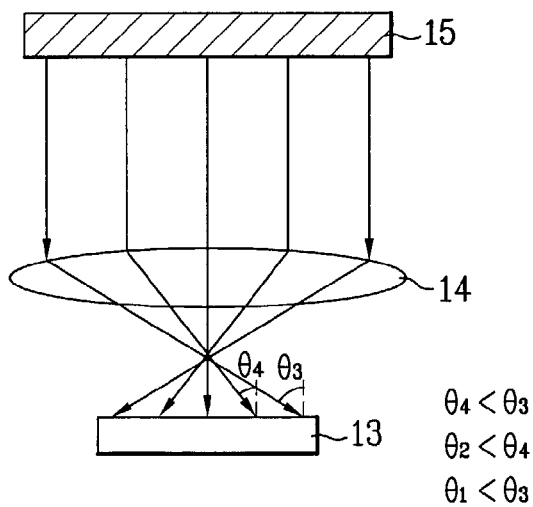
Figure 3:
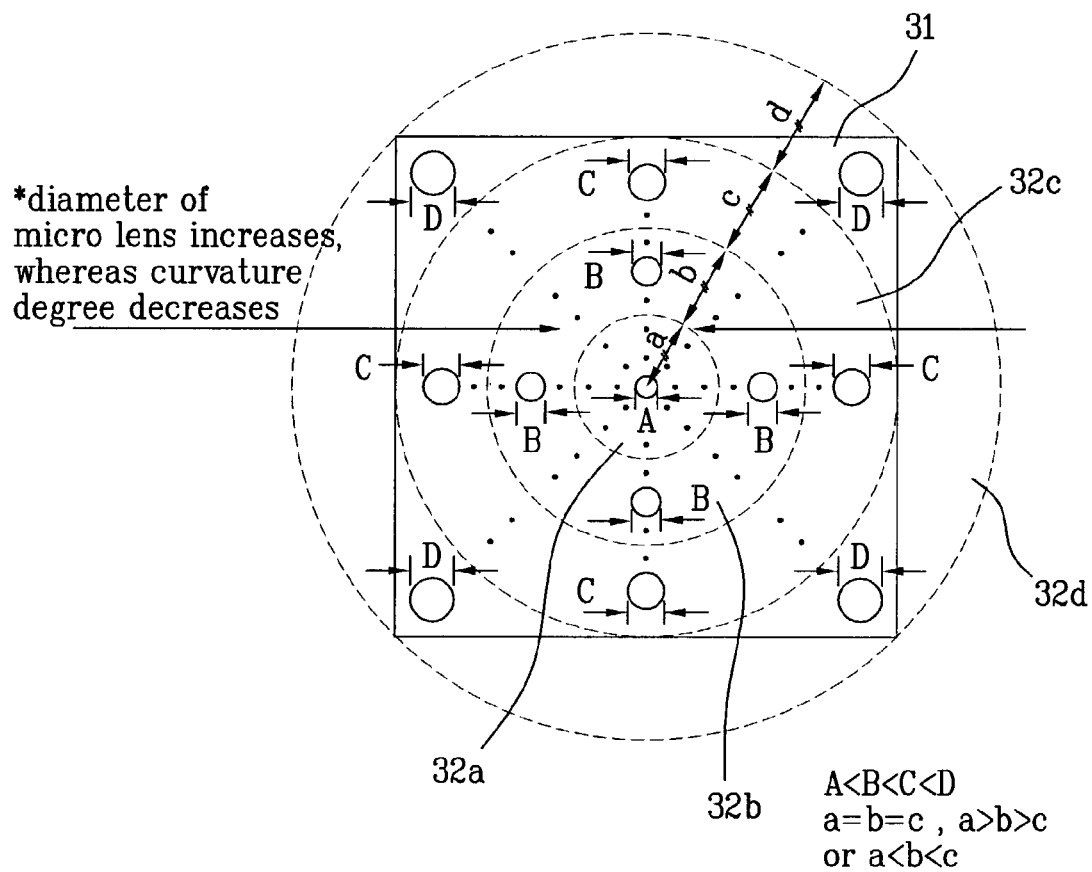
FIG. 3 is a plane view illustrating the change of a micro lens diameter of an image sensor in accordance with the present invention.
Figure 4:
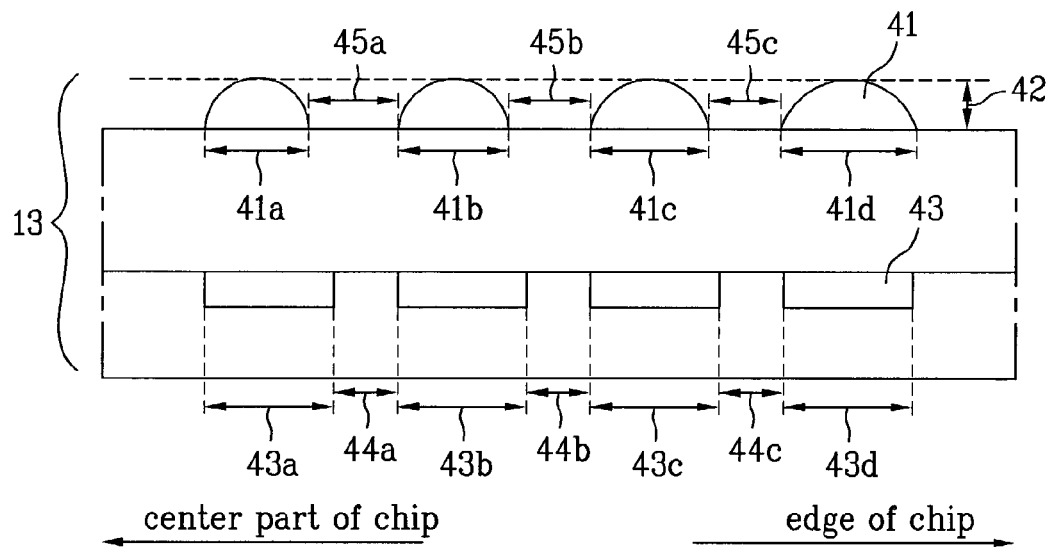
FIG. 4 is a sectional block diagram illustrating an image sensor in accordance with the present invention.

FIG. 3 is a plane view illustrating the change of a micro lens diameter of an image sensor in accordance with the present invention and FIG. 4 is a sectional block diagram illustrating an image sensor in accordance with the present invention.

Figure 5:
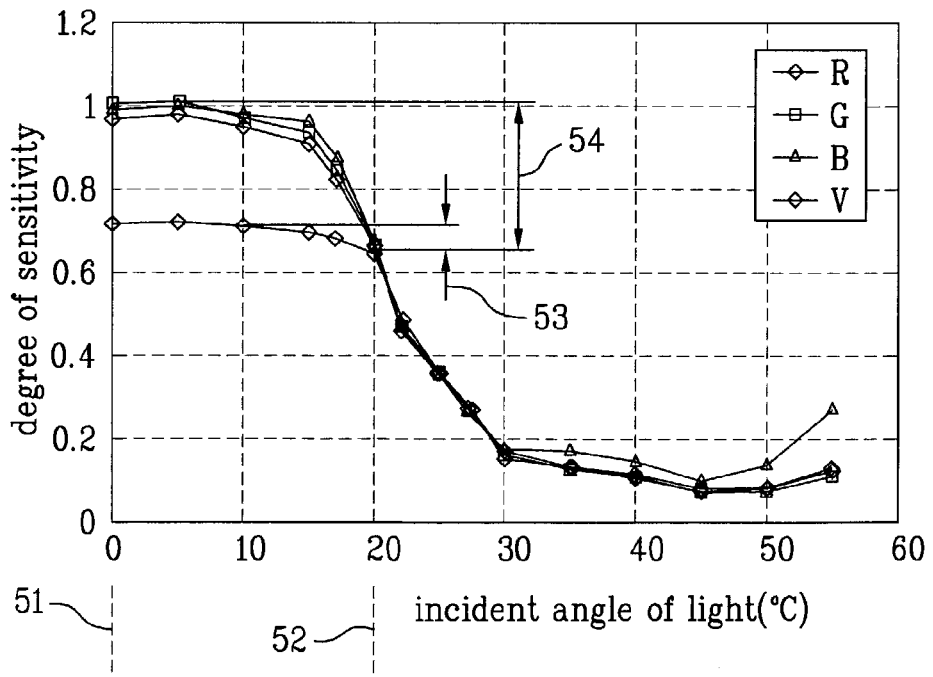
FIG. 5 is a graph illustrating a photo sensitivity difference according to a light incident angle of an image sensor in accordance with the present invention.

FIG. 5 is a graph illustrating a photo sensitivity difference according to a light incident angle of an image sensor in accordance with the present invention.

The construction of a micro lens of an image sensor according to the present invention can be applied to either a CCD image sensor or a CMOS image sensor.

The micro lens of the present invention is devised to have a longer(or shorter) diameter from the center of the chip to the edge thereof to minimize the light incident difference and ultimately to restrain the photo sensitivity difference even in the case of an extreme near-by pick-up.

A micro lens having a diameter which gradually becomes larger will be described below.

The following description refers to a plane view illustrating the micro lens in accordance with the present invention. On the basis of the center of a pixel array area 31, "A" denotes the diameter of micro lenses positioned on a first micro lens diameter divisional section 32a having a first semidiameter from the center. "B" denotes a micro lens diameter positioned on a second micro lens diameter divisional section 32b, which is started from the circumference of the first micro lens diameter divisional, section 32a, having a second semidiameter(a+b) from the center. The diameter "B" has a longer diameter than "A". "C" denotes a micro lens diameter positioned on a third micro lens diameter divisional section 32c, which is started from the circumference of the second micro lens divisional section 32b, having a third semidiameter(a+b+c) from the center. "C" has a longer diameter than "B". "D" denotes a micro lens diameter positioned on a fourth micro lens diameter divisional section 32d, which is started from the circumference of the third micro lens section 32c, having a fourth semidiameter(a+b+c+d) from the center. "D" has a longer diameter than "C".

In this instance, a,b,c, and d may be defined as the same length, or a<b<c<d, or a>b>c>d.

Also, each of the micro lens diameter sections can have either a quadrangular shape or a polygonal shape.

Of course, considering a design margin, not only four micro lens divisional sections 32a to 32d but also more than four or less than four may be provided.

Also, the micro lens diameters may be formed to have longer or shorter diameters toward the outer side even in one micro lens divisional section.

Also, a concave lens can be applied in case that the diameters of the micro lens get shorter from the center to the outer side.

A sectional construction of an image sensor in accordance with the present invention will be described below.

As shown in FIG. 4, micro lenses 41 corresponding to respective light-receiving portions 43 are formed. The widths 43a to 43d of the respective light-receiving portions 43 are equally formed (43a=43b=43c=43d) regardless of their position on a chip(whether on the center part or an edge area of the chip), and the respective light-receiving portions 43 are spaced apart from each other (44a=44b=44c).

At this time, uniform sensitivity is obtained on the center part and edge of the chip by making the width of the light-receiving portions and the distance between them different within a permissible range of a partial resolution difference on the same screen.

This includes increasing or decreasing the width of the light-receiving portions and the distance between them from the center to the outer side.

The diameters 41a to 41d of the micro lenses increase from the center to the edge of the chip(41a<41b<41c<41d).

Because of the change of the diameters 41a to 41d of the micro lenses, the distances 45a, 45b, and 45c between adjacent micro lenses increase toward the center of the chip (45a>45b>45c).

The height 42 of the respective micro lenses 41 may be either equal in all the areas or different according to the design margin.

The degree of curvature change of the micro lenses 41 is controlled in such a way that the depth of focus of the light differs in a permissible range. That is, the diameter of the micro lenses 41 changes within the permissible error range of the depth of focus of the light.

In other words, the micro lenses do not necessarily have the same diameter in all directions. If a central axis of a micro lens is positioned on a line going towards all directions (e.g., radial type) from the center of the chip), the micro-lens can have a shape in which the diameter gradually increases toward the outer side in a complete circle shape.

That is, if a major axis of the micro lens is positioned on a line going from the edge to the center of the chip, the diameter of the major axis increases toward the edge and a minor axis perpendicular to the major axis is designed to be uniform.

The features of the photo-sensitivity of the image sensor in accordance with present invention will be described below.

As shown in FIG. 5, an area 51 in which the incident angle is 0° is the center part of a chip, and an area 52 in-where the incident angle is maximized is at the edge area of the chip. In this instance, a deviation 53 of sensitivity in accordance with the present invention is very small.

This means that the photo-sensitivity of the chip is almost even either on the center or on the edge of the chip. Also, because the incident angle of all the directions has a size that belongs to a permissible range even in case of an extreme near-by pick-up, an effective pick-up can be done.

On the other hand, the related art image sensor has a great sensitivity deviation 54 depending on the incident angle. That is, the sensitivity of the related art image sensor differs when the incident angle is 0° from when the incident angle is within a permissible range (based on 20°). For this reason, all areas except for a portion of the center of the chip have the incident angles out of the permissible range in case of the extreme near-by pick-up, which makes it impossible to pick up the whole object.

Therefore, the image sensor in accordance with the present invention is designed to change its diameter from the center to the edge of the chip, thus minimizing the incident angle difference and ultimately reducing the sensitivity difference in the whole area.

Accordingly, because of the evenness, of the photo-sensitivity in the present invention, even in the case of the near-bye pick-up in which most areas are out of the permissible range, of the incident angle, the pick-up and decoding of the object can be achieved.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An image sensor comprising:
   a plurality of light receiving portions for converting a signal corresponding to the light of an object to an electrical signal; and
   a pixel array area having a plurality of micro lenses formed horizontally above the light receiving portions and respectively corresponding to the light receiving portions to focus the light, wherein the diameters of the respective micro lenses formed horizontally above the light-receiving portions vary as going from the center to the edge of the pixel array area and wherein the diameter of the micro lens changes in a unit of a plurality of micro lens diameter divisional sections having their own semidiameters (a), (a+b), (a+b+c) . . . , (n) which increase on the basis of the center of the pixel array area, and the semidiameter (n) has the same length as the length between the center of the pixel array area and its edge.

2. The image sensor of claim 1, wherein the length of the respective semidiameters which divide the micro lens diameter section increases either with the same length (a=b=c), or with a decreasing length (a>b>c), or with an increasing length (a<b<c).

3. The image sensor of claim 1, wherein the diameters of the micro lenses either increase or decrease toward the edge of the pixel array area on the basis of the center of the pixel array area.

4. The image sensor of claim 1, wherein the micro lenses have the same diameter as one another in the same micro lens diameter divisional section, the diameters of the micro lenses increasing or decreasing toward the outer side of the micro lens diameter divisional section.

5. The image sensor of claim 1, wherein the light portions have the same width as one another and the distance between the respective light receiving portions is uniform.

6. The image sensor of claim 1, wherein the width of the light receiving portions and the distance there between increase or decrease from the center to the outer side of the light receiving portion.

7. The image sensor of claim 1, wherein the distance between the micro lenses is maximum at the center part of the pixel array area and gradually decreases toward the edge thereof, because the diameter of the micro lens increases from the center of the pixel array area to the edge thereof.

8. The image sensor of claim 1, wherein the construction of the micro lenses is applied to a CCD image sensor or a CMOS image sensor.

9. The image sensor of claim 1, wherein each of the micro lens diameter sections has a quadrangular shape or a polygonal shape.

10. An image sensor comprising:
    a plurality of light-receiving portions for converting a signal corresponding to the light of an object to an electric signal; and
    a pixel array area having a plurality of micro lenses formed above the light-receiving portions and respectively corresponding to the light-receiving portions to focus the light, wherein the diameter of the micro lens changes in a unit of a plurality of micro lens diameter divisional sections having their own semidiameters (a), (a+b), (a+b+c) . . . , (n) which increase on the basis of the center of the pixel array area, and the semidiameter (n) has the same length as the length between the center of the pixel array area and its edge.

11. The image sensor of claim 10, wherein the length of the respective semidiameters which divide the micro lens diameter section increases either with the same length (a=b=c), or with the decreasing length (a>b>c), or with the increasing length (a<b<c).

12. The image sensor of claim 10, wherein the micro lenses have the same diameter as one another in the same micro lens diameter divisional section, the diameters of the micro lenses increase or decrease toward the outer side of the micro lens diameter divisional section.

13. The image sensor of claim 10, wherein the light-receiving portions have the same width as one another and the distance between the respective light-receiving portions is uniform.

14. The image sensor of claim 10, wherein the width of the light-receiving portions and the distance between themselves increase or decrease from the center to the outer side of the light-receiving portion.

15. The image sensor of claim 10, wherein the distance between the micro lenses is maximum on the center part of the pixel array area and gradually decreases toward the edge of it, because the diameter of the micro lens increases from the center of the pixel array area to the edge of it.

16. The image sensor of claim 10, wherein the construction of the micro lenses is applied to a CCD image sensor or a CMOS image sensor.

17. The image sensor of claim 10, wherein each of the micro lens diameter sections has a quadrangular shape or a polygonal shape.

* * * * *